REUSABLE SHIELDS FOR SELECTIVE ELECTRODEPOSITION

Filed Dec. 22, 1972

3,835,017

REUSABLE SHIELDS FOR SELECTIVE ELECTRODEPOSITION

Pat F. Mentone, St. Paul, Thomas I. Myers, West St. Paul, Gary D. Jensen, St. Paul, and Robert E. Miettunen, Minneapolis, Minn., assignors to Buckbee-Mears Company, St. Paul, Minn.

Filed Dec. 22, 1972, Ser. No. 317,372
Int. Cl. C23b *5/48*; B23p *1/02*
U.S. Cl. 204—224 R 6 Claims

ABSTRACT OF THE DISCLOSURE

A device for selectively shielding portions of lead frames so that a metal can be selectively electro-deposited in predetermined regions of lead frames or the like.

BACKGROUND OF THE INVENTION

Field of the Invention

This invention relates generally to shielding devices for use during electrodepositions of an article and, more specifically, to a reusable shielding device for selectively shielding such devices as a set of lead frames. The lead frames generally have square corner conductors spaced at intervals in the lead frames. The present invention forms an electrolyte seal between the exposed areas and the protected areas of such devices as lead frames.

Description of the Prior Art

There are numerous devices available for shielding a portion of a circuit or the like so that the material can be selectively electrodeposited onto the circuit or onto an object. One of the most commonly used shields is ordinary masking tape which is selectively applied to the object before electrodeposition. After electrodeposition, the masking tape is removed thus leaving the area covered with masking tape free from any electrodeposited material. However, such techniques are time consuming and leave adhesive residue on the object unless a special cleaning solvent is used. Furthermore, masking tape is only suitable for strong articles which would not be broken or torn by the removal of the masking tape. Therefore, such items as lead frames which usually comprise a central area that is connected to an outer frame by a set of small fragile leads are not suitable for shielding by using masking tape. That is, the removal of the masking tape would bend or tear the fragile leads thus destroying the lead frame. Therefore, one technique used to selectively plate onto these fragile lead frames is to use photoresist to define the pattern that is to be shielded from electrodeposition. However, this technique has been so time consuming and costly that it has been easier to electrodeposit material over the entire lead frame even though in the case of electrodepositing gold, this amounts to using two to five times as much gold more than if only the central portion of the lead frame was electrodeposited with gold.

The present invention overcomes this costly problem by providing an apparatus or reusable shield which shields or protects portions of the lead frames from electrodeposition while allowing one to electrodeposit material uniformly and evenly on the areas that are not protected. The present invention also includes a process for electrodeposition of gold utilizing the apparatus of the invention.

Another application for the present invention is the protective covering of characters on flexible printing belts. Generally, the raised characters on the flexible printing belts wear out quite rapidly. In order to prolong the life of the characters, the characters should have a hardened surface. However, to harden the characters would also harden the belt thus causing the belt to quickly break down due to the continued flexing the belt receives. The present invention provides a means for masking off those portions of the belt that are not to be hardened. Thus, the characters are left exposed through the openings in the shield so that a layer of chromium can be deposited over the characters.

SUMMARY OF THE INVENTION

Briefly, the invention comprises an apparatus having a first rigid backing plate with a resilient pad thereon and a second matching rigid front plate having a resilient pad thereon with openings located in predetermined positions. The article to be plated is sandwiched between the resilient pad on the backing plate and the resilient pad on the front plate to prevent seepage of electrolyte around the article. By sealing around the article, it prevents spotty and irregular deposition of material on the protected portions of the article. In addition, an air bag is provided so one can firmly and uniformly hold the article between the two plates. The process utilized with the present invention includes agitation of the nozzles to eliminate trapped air bubbles as well as utilization of pulse plating to eliminate distortions of the shielding apparatus.

BRIEF DESCRIPTION OF THE DRAWING

Referring to the drawing.

DESCRIPTION OF THE PREFERRED EMBODIMENT

Figure 1:
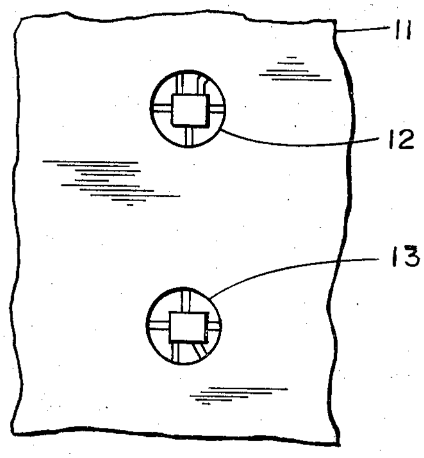
FIG. 1 shows a portion of the front shield with the openings therein for electrodeposition of material thereon.
Figure 2:
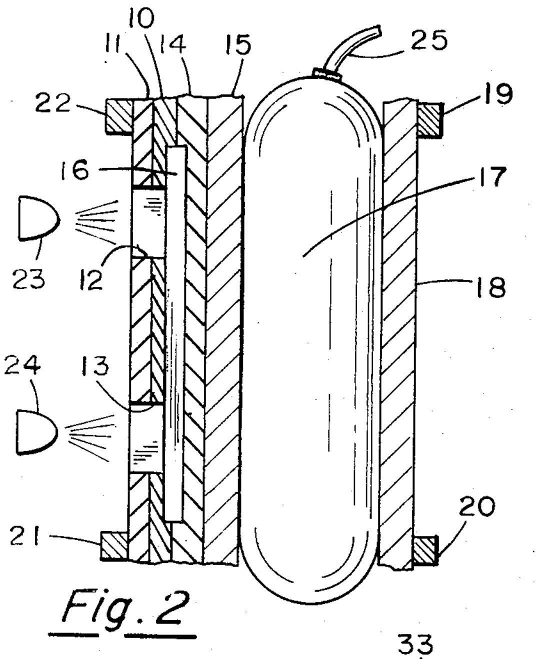
FIG. 2 is a side sectional view showing the shield in operation with nozzles agitating electrodeposition fluid next to the openings.

Referring to FIG. 1 and FIG. 2, reference numeral 11 generally denotes a front plate having an opening 12 and an opening 13 located therein. While only two openings are shown in FIG. 1, it should be understood that in actual practice, the front plate may have as much as five square feet of area and hundreds of openings therein. Located immediately adjacent and behind front plate 11 is a first resilient member 10 and a second resilient member 14 which are shown conforming to the outline of lead frame 16. Resilient member 10 has openings therein which coincide with the openings in front plate 11 while resilient member 14 has no openings therein. Supporting resilient member 14 is a backup plate 15. Resilient material 10 and 14 is any suitable elastomer which is compatible with the electroplating bath. An example of a suitable material is silicone rubber which has a minimum thickness on the order of about .1 of an inch.

Generally, the elastomer should register a maximum hardness of about 40 on the "A" scale of a Shore Scleroscope Tester. If the elastomer is harder it is extremely difficult to obtain a gasket-like seal over the areas to be protected from electrodeposition of material. The elastomer can be fastened to the backing plate by any suitable adhesive that is compatible with the electroplating bath.

In order to securely and uniformly sandwich lead frame 16 between member 11 and 15, there are provided a pair of stops 21 and 22 which abut against front plate 11 and a pair of stops 19 and 20 which abut against a support plate 18. Located between support plate 18 and back plate 15 is an inflatable air bag 17 with a valve stem 15 thereon. Located immediately in front of openings 12 and 13 in front plate 11 are a pair of nozzles 23 and 24 which direct the electroplating fluid into the openings around the central portion of the lead frames. In order to prevent air bubbles from lodging in the openings, it is preferred to agitate the nozzles in the bath during the electrodeposition of material. Typically, front plate 11 and back plate 15 can have a minimum thickness of about .1 of an inch and are made from a suitable material such as an epoxy fiberglass laminate or plastic.

Before proceeding with the description of the preferred embodiment shown in FIG. 2, reference will now be made to FIGS. 3 and 4 to illustrate the problem associated with the selective masking of multiple lead frames. Reference numeral 29 denotes a sheet of six lead frames connected together. The central region of the lead frame requires a gold plating. Reference numerals 31, 32, 33, 34, 35 and 36 all denoted central areas of a lead frame which are connected to an outside area 30. For example, connecting lead frame central area 31 to the exterior portion 30 is a first conductor 38, a second conductor 39, a third conductor 40, a fourth conductor 41 and a fifth conductor 42. Typically, the lead frames may be made from material as thin as .0050 of an inch. The conductor leads thus have a thickness of as small as .0050 inches and a width of .0050 inches. Thus, the leads or conductors connecting the central area to the exterior are extremely fragile. The difficulty with masking or attempting to mask these fragile leads is that the adhesive on the masking tape bends or tears the fragile leads when one attempted to strip the masking from the lead frame. In addition, it is difficult to block off a lead frame, tape or other shielding devices because of the abrupt changes in geometry of the lead frames, i.e., they usually have square or sharp corners. However, the present invention overcomes this by providing a front plate 11 having a resilient pad 10, and a backing plate 15 with a resilient pad 10 thereon. In the preferred embodiment, the resilient pads are made of silicone rubber having a minimum thickness of approximately .1 inch. The back up plate 15 comprises a rigid material such as PVC or the like. The two plates are hinged together through a common hinge 51 so that they can be folded together as shown in FIG. 2. Located in the front of plate 11 are a plurality of holes 50 which are designed so as to correspond with the areas of the lead frames which are to be selectively plated with a material.

Figure 3:
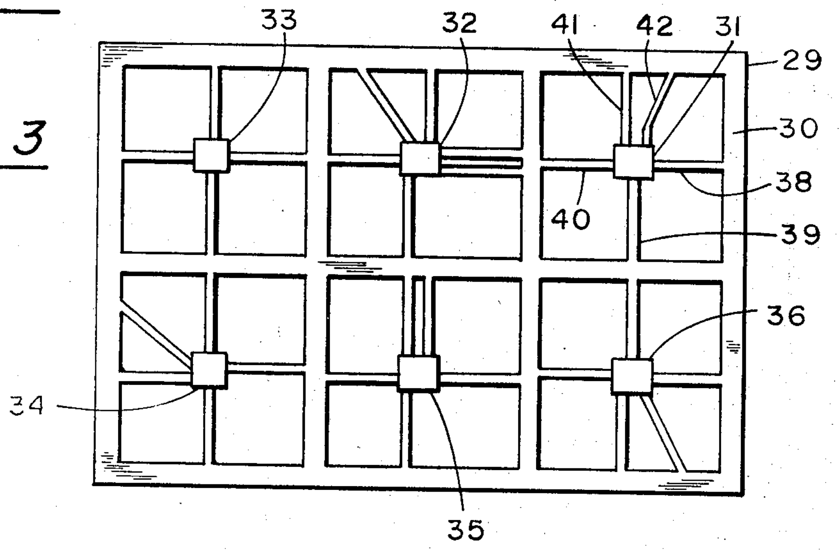
FIG. 3 shows a portion of a sheet of lead frames which are to be selectively electrodeposited with material.
Figure 4:
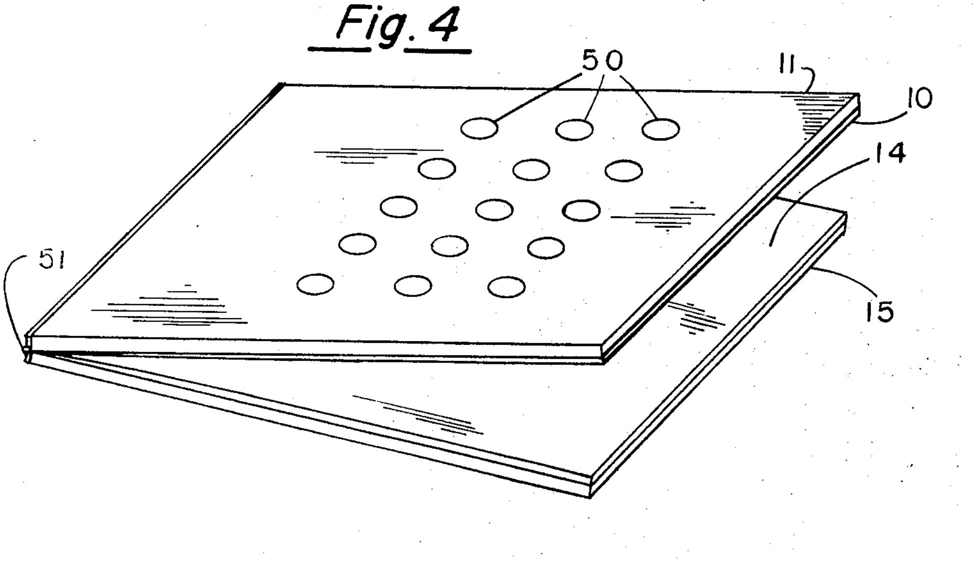
FIG. 4 shows the apparatus shown in FIG. 2 for clamping and holding the lead frame during the electrodeposition process.

To utilize the invention, one places the lead frames shown in FIG. 3 into the shielding apparatus shown in FIG. 4. In this position the lead frames are sandwiched firmly in the shielding apparatus with the openings in the shield corresponding to the central area of the lead frames. Next, one folds the front plate 11 and back plate 12 together. Then one places the entire apparatus into the electroplating bath where stops 21, 22, 19 and 20 are located (FIG. 2). By hinging the apparatus at one end and closing the other, one can prevent the lead frames from slipping within the shielding apparatus; however, it does not effectively seal off the sections of the lead frame which are to be shielded from the electroplating bath. In order to seal around the lead frames, one must firmly hold the resilient backing material against the lead frames. However, it is extremely difficult to clamp the shielding apparatus because it is difficult to apply uniform pressure to the apparatus. That is, uneven pressure brought about by edge clamps generally causes creeping of the resilient material and does not provide for uniform compression over the entire shielding apparatus.

The present invention also overcomes the problem associated with clamping by providing an air bag 17 which is inflated with air so that the air pressure uniformly forces plate 15 and resilient plate 14 against the lead frame. This causes the resilient material to compress and flow into the regions which are void of lead frame material. Thus, the unit forms a gasket or seal around the leads leaving exposed the region which is visible through the openings in the shield.

To begin the electrodeposition, after the shield is in place, the operator moves the nozzles 23 and 24 back and forth in front of the openings in plate 11. Next, the plating unit (not shown) is turned on to electroplate in the selected areas. In order to maintain the proper alignment between the article to be spot plated and the shield, it has been found necessary to utilize an electroplating bath that does not exceed about 110° F. At this temperature, there is very little difference in thermal expansion between the shield and the article to be plated. However, if the temperature of the bath is maintained at a higher temperature, the difference in thermal expansion between the shield and the article causes the article to become misregistered with respect to the openings in the shield which results in improperly plated articles. Maintaining the bath at this temperature can be achieved by plating for a short time and then shutting off the unit to prevent the bath from heating up. However, the preferred method is to use pulse plating techniques in which the power is cycled on and off. Typically, a pulse plating on off time which has been found satisfactory is a plating cycle in which the on time is about 10% and the off time is about 90%. After finishing electroplating, the operator shuts off the electrodeposition unit, deflates the air bag 17 and removes the lead frame shield from the electrodeposition bath. After removing the shield, the operator opens the shield and lifts out the lead frames which are electrodeposited only in the regions that were exposed to the electrodeposition bath.

With this apparatus, it is preferred not to have the thickness of the front plate larger than ¼ of an inch because air bubbles tend to form in deeper holes, thus preventing the electrolyte solution from coming in contact with the area to be plated.

Although the present invention has been described with respect to lead frames, it is apparent the shield can also be used for electrodeposition of chromium on flexible printing belts or the like. Satisfactory results have been obtained with the present invention with exposed areas as small as .120 diameter and having about .250 inch between centers.

In order to make electrical contact with the lead frame and insure proper registration of the lead frame with the opening in the shield, a pair of guide pins or aligning pins are mounted in the frame. When the frame is closed the pins form electrical contact with the lead frame as well as holds the lead frame from slipping within the lead frame.

We claim:

1. A shield for selectively masking off regions on objects having an irregular surface which is to be selectively electrodeposited, comprising:

a first member having a set of predetermined openings therein which are located at predetermined positions in said first member;

a first sheet of elastomer material located adjacent said first member and having a set of openings therein which are located in register with the set of predetermined openings which are located at predetermined positions in said first member to thereby allow flow of electrolyte in and out of the predetermined openings of said first member and said first sheet of elastomer;

a second member;

a second sheet of elastomer material located on said second member said second member and said sheet of elastomer material suitable for supporting an object to be selectively electrodeposited, said article to be selectively electrodeposited having abrupt corners;

means for holding said first member and said second member in alignment so that an article to be selectively electrodeposited can be positioned between said first sheet of elastomer material and said second sheet of elastomer material on said second member, said first sheet of elastomer material and said second sheet of elastomer material thereby supporting the article to be electroplated with only selective portions of the article to be electrodeposited exposed through the opening, in said first member and said first elastomer sheet; and further means for uniformly compressing said elastomer material against the article to be plated and said first member to thereby shield portions of the article from an electrodeposition bath.

2. The apparatus of claim 1 wherein said elastomer has a maximum hardness of about 40 on the A scale of a Shore Scleroscope.

3. The apparatus of claim 2 wherein said front plate has a minimum thickness of about .1 of an inch.

4. The apparatus of claim 3 wherein said elastomer has a minimum thickness of about .1 of an inch.

5. The invention of claim 4 wherein said means for uniformly compressing said elastomer material against the article to be plated comprises an inflatable air bag.

6. The invention of claim 5 wherein said means for holding said first member and said second member in alignment comprises a hinge fastened to said first member and said second member.

References Cited

UNITED STATES PATENTS

| | | | |
|---|---|---|---|
| 2,328,626 | 9/1943 | Dowling | 204—15 |
| 3,723,283 | 3/1973 | Johnson | 204—224 |

FOREIGN PATENTS

| | | | |
|---|---|---|---|
| 1,098,182 | 1/1968 | Great Britain | 204—15 |
| 820,952 | 9/1959 | Great Britain | 204—15 |

THOMAS M. TUFARIELLO, Primary Examiner

U.S. Cl. X.R.

204—15